United States Patent [19]

Anzawa et al.

[11] Patent Number: 5,617,300

[45] Date of Patent: Apr. 1, 1997

[54] CONNECTING METHOD OF PRINTED SUBSTRATE AND APPARATUS

[75] Inventors: Seiichi Anzawa; Syoichi Yoda, both of Nagano, Japan

[73] Assignee: Nagano Japan Radio Co., Ltd., Nagano-ken, Japan

[21] Appl. No.: 233,961

[22] Filed: Apr. 28, 1994

[30] Foreign Application Priority Data

Aug. 23, 1993 [JP] Japan .................................. 5-230960
Aug. 23, 1993 [JP] Japan .................................. 5-230961

[51] Int. Cl.⁶ ............................................... H05K 1/11
[52] U.S. Cl. ............................ 361/795; 29/830; 361/790; 361/803
[58] Field of Search ..................... 29/830, 840; 361/792, 361/793, 794, 795, 790, 803, 767, 768; 174/255; 439/876

[56] References Cited

U.S. PATENT DOCUMENTS

| | | | |
|---|---|---|---|
| 3,795,047 | 3/1974 | Abolafia et al. | 29/830 |
| 3,867,759 | 2/1975 | Siefker | 29/830 |
| 4,640,010 | 2/1987 | Brown | 29/840 |
| 4,788,766 | 12/1988 | Burger et al. | 29/830 |
| 5,031,308 | 7/1991 | Yamashita | 29/840 |
| 5,142,775 | 9/1992 | Wiley | 29/830 |
| 5,435,057 | 7/1995 | Binora et al. | 29/830 |

FOREIGN PATENT DOCUMENTS 3-227099  8/1991  Japan .

OTHER PUBLICATIONS

"AMP Interconnecting ideas," pp. 249 and 250 of the catalog, Revision, Dec., 1989.
"ITT Cannon .25 Connectors," May, 1989, pp. 1–12.

Primary Examiner—P. W. Echols

[57] ABSTRACT

When connecting a second printed substrate 3 with a first printed substrate 2, a plurality of first connection patterns 4s, 4b, for example, including through holes 2h are provided on the first printed substrate 2, a plurality of second connection patterns 5a, 5b facing the first connection patterns 4a, 4b are provided on an under surface 3d of the second printed substrate 3, and the first connection patterns 4a and the second connection patterns 5a are soldered using a reflow system or a flow system, thereby providing simplification, miniaturization, and reduction of cost together with noise reduction, lower loss, and high reliability.

13 Claims, 5 Drawing Sheets

CONNECTING METHOD OF PRINTED SUBSTRATE AND APPARATUS

BACKGROUND OF THE INVENTION

I. Field of the Invention

This invention relates to a connecting method of printed substrates in which an optional printed substrate is connected with another printed substrate such as a multi-layer printed substrate.

II. Description of the Prior Art

Conventionally, surface-mount parts such as IC chips are mounted on a printed substrate in such a way that solder (cream solder) is coated on a connection pattern formed on a surface of the printed substrate, and on such formed surface, leads protruded from a main body of the surface-mount part are soldered by a reflow system, those of which are disclosed in Japanese Patent Application Laid Open No. Hei-3-227099 in 1991.

If the optional printed substrate is connected with the other printed substrate to produce in appearance one sheet of printed substrate, the relatively expensive multi-layer substrate is used only for the other printed substrate, a relatively inexpensive single-layer substrate can be used for the optional printed substrate, this produces an advantage in largely reducing cost.

In general, however, the printed substrates are opposingly positioned across the separator, then junctioned to each other by a fixture method (means) such as screws, and electrically connected by using a connector or a lead wire or the like, this separately requires constituent members including connectors and lead wires, and results in higher cost and lower reliability due to its complicated structure. In addition, uselessly occupied spaces increase resulting in a larger size of the printed substrate together with increased noise and loss when applied to a high-frequency circuit.

SUMMARY OF THE INVENTION

An object of the invention is to provide a connecting method of a printed substrate capable of realizing lower cost and improving reliability by simplifying its structure without using separately prepared constituent members such as connectors or lead wires.

Another object of the invention is to provide a connecting method of a printed substrate which eliminates uselessly occupied spaces to realize miniaturization of the printed substrate and reduces noise and loss even when applied to a high-frequency circuit.

To achieve the object, one method of the invention is characterized in that, when connecting a second printed substrate 3 to a first printed substrate 2, a plurality of first connection patterns 4a, 4b is provided on an upper surface 2u of the first printed substrate 2, a plurality of second connection patterns 5a, 5b facing the first connection patterns 4a, 4b are provided on an under surface of the second printed substrate 3. Further the first connection patterns 4a and the second connection patterns 5a are soldered by a fellow system using a cream solder H. In this case, a through hole 2h may preferably be provided on each of the first connection patterns 4a.

Another method of the invention is characterized in that, when connecting a second printed substrate 3 to a first printed substrate 2, a plurality of first connection patterns 4a, 4b (having through holes 2h) are provided on the first printed substrate 2, a plurality of second connection patterns 5a, 5b and a vent hole 3s (facing the first connection patterns 4a) are provided on the second printed substrate 3. Further the first connection patterns 4a and the second connection patterns 5a are soldered, for example, by a flow system using cream solder, or by the flow system using a solder dipping vessel. In this case, the vent holes 3h are formed with through holes 3h. A diameter of the through holes 2h in the first printed substrate 2 may differ from a diameter of the through holes 3h in the second printed substrate 3. A soldering process can then be performed by inserting wire material 7 between the through holes 2h in the first printed substrate 2 and the through holes 3h in the second printed substrate 3.

In either of these methods, a multi-layer printed substrate 6 in which a plurality of unit substrates 6a, 6b, 6c are laminated may preferably be utilized for the second printed substrate 3, where the multi-layer printed substrate 6 includes a coil part M, in which coil patterns 8a, 8b are provided on a plurality of unit substrates 6a, 6b.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWING

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENT

Embodiments according to the invention are described in detail in accordance with the drawings.

Figure 1:
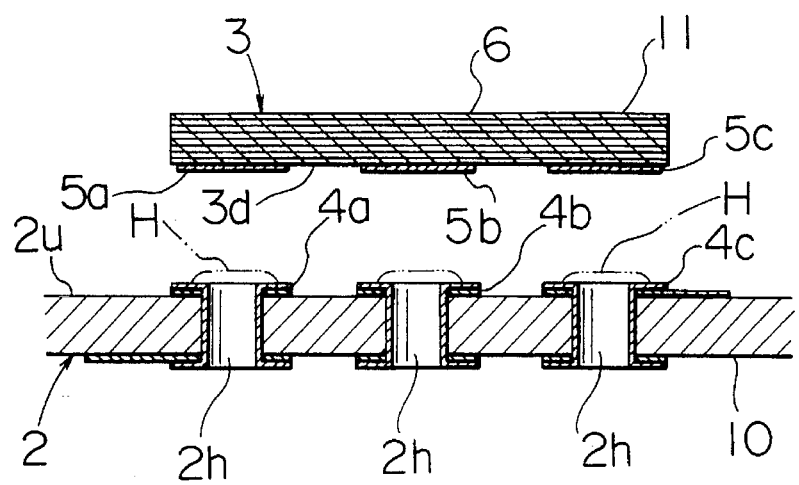
FIG. 1 is a vertical sectional view showing part of each printed substrate whose connection is performed by a connecting method according to a preferred embodiment of the invention.
Figure 2:
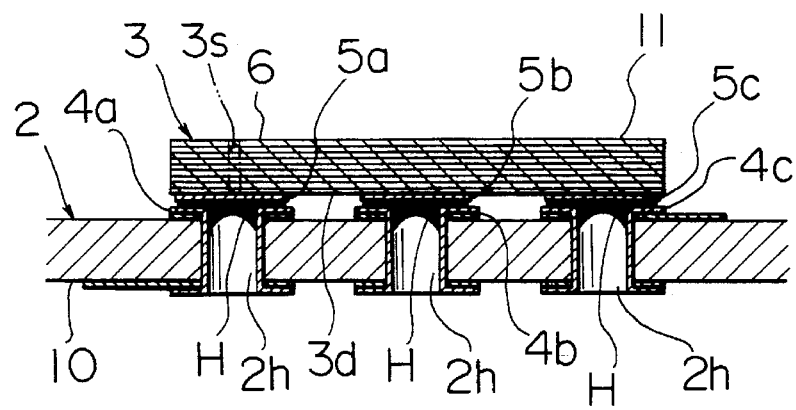
FIG. 2 is a vertical sectional view showing part of a printed substrate whose connection is performed by a connecting method of the same.
Figure 3:
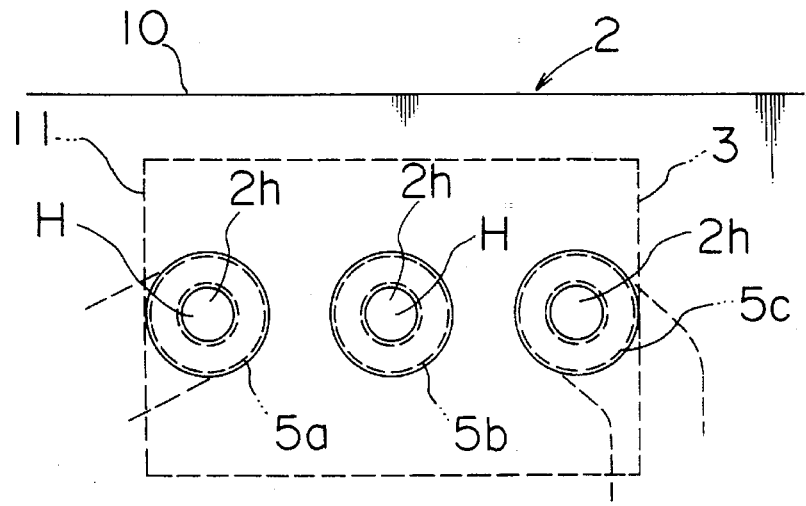
FIG. 3 is a bottom view showing part of a printed substrate whose connection is performed by a connecting method of the same.

A connecting method according to a preferred embodiment of the invention is described by referring to FIGS. 1 to 3, In FIG. 1, numeral 10 depicts a main printed substrate constituting a first printed substrate 2, where, for example, various kinds of inexpensive double-sided single-layer substrates such as glass epoxy resin substrates can be used.

Numeral 11 depicts an auxiliary printed substrate constituting a second printed substrate 3 which may be a multi-layer printed substrate 6 as shown in FIGS. 7 to 11.

Figure 7:
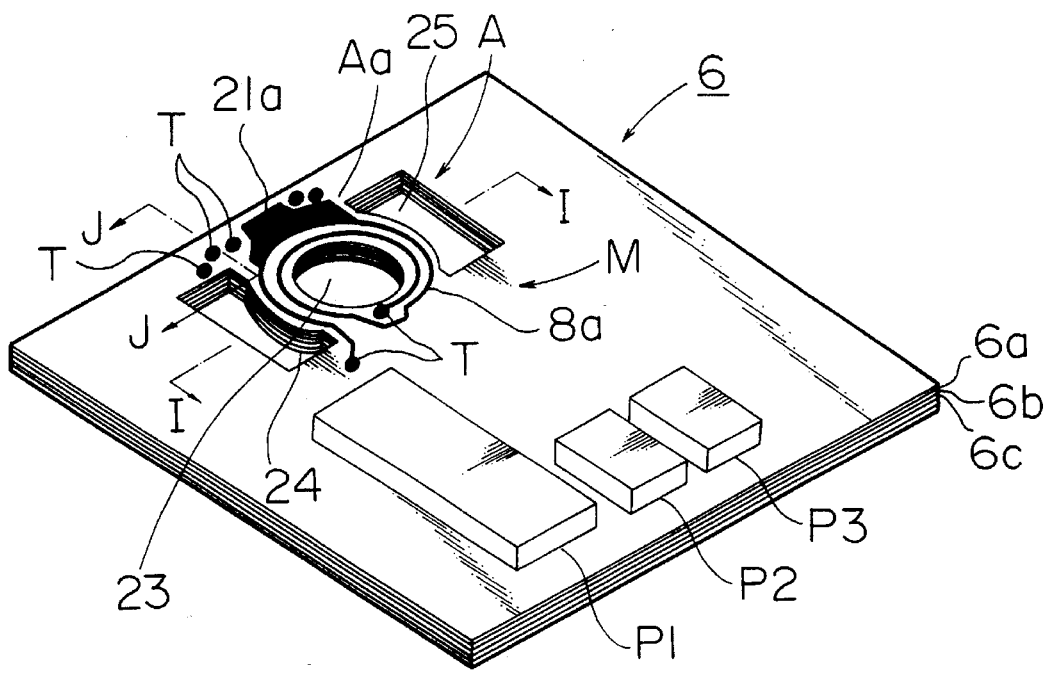
FIG. 7 is a perspective view of a multi-layer printed substrate (a second printed substrate) used in each connecting method of the invention.
Figure 8:
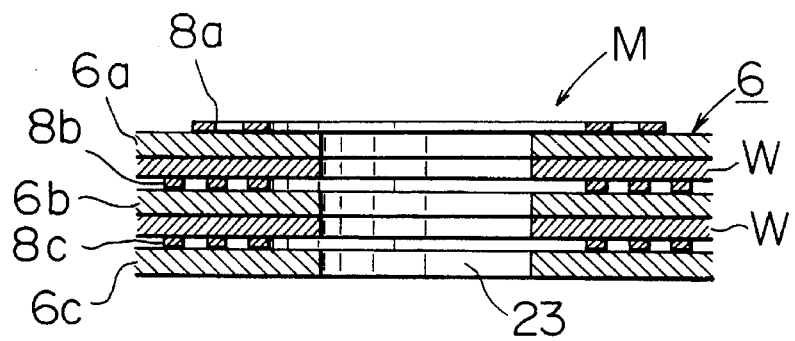
FIG. 8 is a sectional view taken along lines I—I in FIG. 7.
Figure 10:
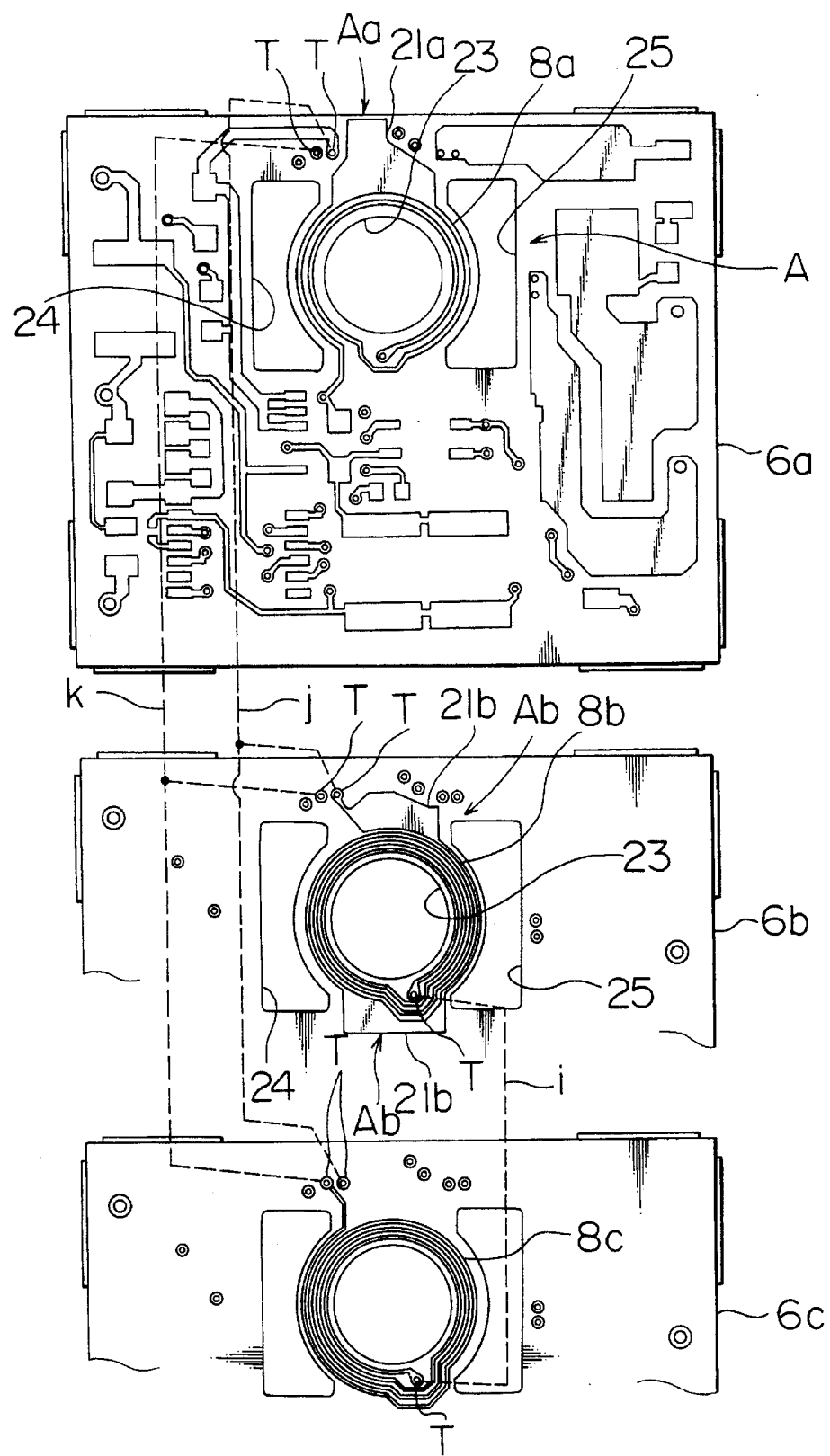
FIG. 10 is a plan view of each unit substrate in the multi-layer printed substrate.

The multi-layer printed substrate 6 is formed of a plurality of laminations of relatively thinner unit substrates 6a, 6b, 6c each having a thickness of an extent of 0.2 mm as shown in FIG. 7. In FIG. 10, each unit substrate 6a, 6b, 6c is shown in an exploded view. On the multi-layer printed substrate 6, the unit substrates 6a, 6b, 6c are, as shown in FIG. 8, sequentially laminated by inserting therebetween insulating plates W which are an adhesive agent having a thickness of about 0.2 mm to form one laminated sheet. Therefore, the multi-layer printed substrate 6 is one sheet made of a plurality of unit substrates with a total thickness extending several mm.

On the other hand, an area A is secured for forming a coil part M in part of the multi-layer printed substrate 6. In FIG. 7, the multi-layer printed substrate 6 is intrinsically used as an ordinary multi-layer printed substrate in which various kinds of electronics parts P1, P2, P3 such as IC chips are surface mounted. However, according to the invention, the area A is within an area having predetermined scope or boundaries and is is secured on part of mount surface in the multi-layer printed substrate 6. Coil patterns 8a, 8b, 8c as shown in FIG. 10 are printed on each unit substrate 6a corresponding to the area A. In this arrangement, the coil patterns 8a, 8b, 8c may preferably be provided on one-side of each unit substrate 6a or on two sides of the same. Numerals 21a, 21b depict heat radiation patterns provided in a unitary form by widely forming part of each coil pattern 8a, 8b. The heat radiation patterns 21a, 21b are formed in a shape where vacant spaces Aa, Ab in the unit substrates 6a are filled as shown in FIG. 10. Thus, heat generated in the coil patterns 8a, 8b are diverged through the heat radiation patterns 21a, 21b to achieve an effective heat radiation.

Figure 6:
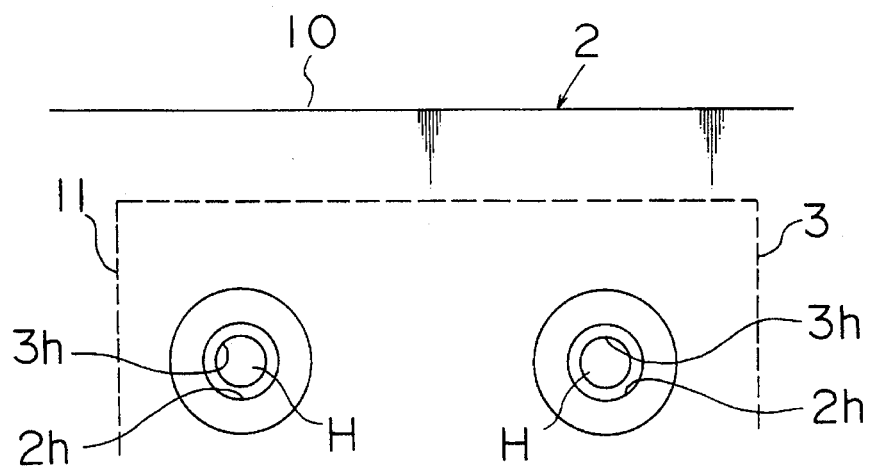
FIG. 6 is a bottom view showing part of each printed substrate whose connection is performed by a connecting method of the same.
Figure 9:
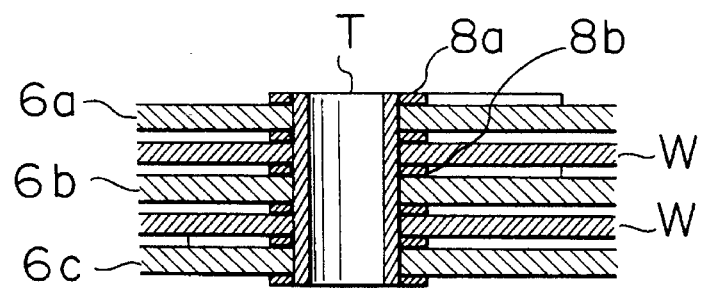
FIG. 9 is a sectional view taken along lines J—J in FIG. 7.

When laminating the unit substrates 6a, as shown in FIG. 9, the coil patterns 8a, 8b, 8c are connected by through holes T, where the unit substrates 6a, 6b, 6c are provided with the respective coil patterns 8a, 8b, 8c may preferably be provided on all of unit substrates 6a, 6b, 6c or provided on only some of the unit substrates 6a, 6b, 6c. Furthermore, the coil patterns 8a are provided with the through holes T which may preferably be provided on all of coil patterns 8a, 8b, 8c or on some of the coil patterns 8a, 8b, 8c. In FIG. 10, dotted lines i, j, k designate portions which are connected by the through holes T. On an inside and both out-sides of the coil patterns 8a, 8b, 8c in the multi-layer printed substrate 6 are formed core inserting holes 23, 24, 25 respectively, divided cores 26p and 26q are, as shown in FIG. 6, inserted into the core inserting holes 23, 24, 25 from upper surface-side and lower surface-side of the multi-layer printed substrate 6 to produce one combined body which is secured by a C-character shaped holding piece 27. This directly forms the coil part M having a core 26 on part of the multi-layer printed substrate 6.

In this way, in appearance, only the multi-layer printed substrate 6 itself is provided irrespective of presence of the coil part M, this provides a thinner thickness as a whole to achieve miniaturization and to eliminate the mount of the coil part separately prepared for the multi-layer printed substrate 6. Because no terminal-lead is used in the coil parts a possibility of contact failure is prevented noise is reduced even when using the invention in a high-frequency circuit.

When connecting the auxiliary printed substrate 11 with a main printed substrate 10, first as in FIG. 1, the main printed substrate 10 is provided with a plurality of first connecting patterns 4a, 4b, 4c having through holes 2h. A plurality of second connection patterns 5a, 5b, 5c facing first connection patterns 4a, 4b, 4c are provided on an under surface (3d) of the auxiliary printed substrate 11. In FIG. 1, the first connection patterns 4a, which is coated with cream solder H, in the main printed substrate 10, is overlapped with the second connection patterns 5a in the auxiliary printed substrate 11, and soldered by reflow system. In the reflow system soldering, the portion to be soldered is allowed first to contact to the cream solder H and then soldered by heating.

In this system, the solder enters into the through holes 2h, thus the flow system using a solder dipping vessel is available. On soldering by the flow system, a vent hole 3s shown by virtual lines in FIG. 2 is provided on the second printed substrate 3 in the second connection patterns 5a. This arrangement permits degassing when the solder enters in. The soldering by the flow system means a soldering system that the portion to be soldered is allowed to contact with molten solder contained in a solder dipping vessel.

The first connection patterns 4a and the second connection patterns 5a may preferably be prepared as a dedicated pattern only for mechanically connecting the printed substrate 10 and 11, or as a pattern simultaneously used for connecting an electrical circuit.

Figure 11:
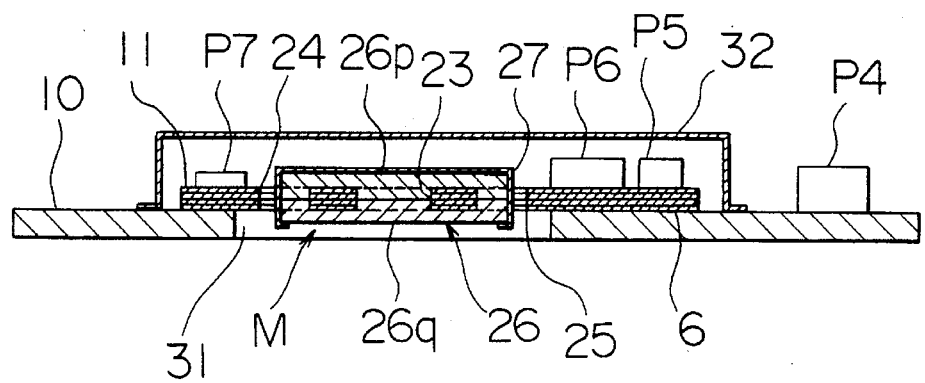
FIG. 11 is a vertical sectional view of a more concrete printed substrate whose connection is performed by each connecting method according to the invention.

FIG. 11 shows a more concrete printed substrate, where 31 depicts a containing hole for containing the core 26 provided on the main printed substrate 10, P4, P5, P6 and P7 are various kinds of electronics parts such as IC chips, and 32 is a shield cover for covering the auxiliary printed substrate 11. The shield cover 32 may preferably be provided directly on part of the unit substrates 6a, 6b, 6c in the multi-layer printed substrates 6.

In such connection method, uselessly occupied spaces are eliminated without requiring the separately prepared constituent members such as lead wires, thereby resulting in simplification of the structure, lower cost, improvements in reliability, and miniaturization. Even when using the invention in a high-frequency circuit, noise prevention and loss reduction are realized.

Figure 4:
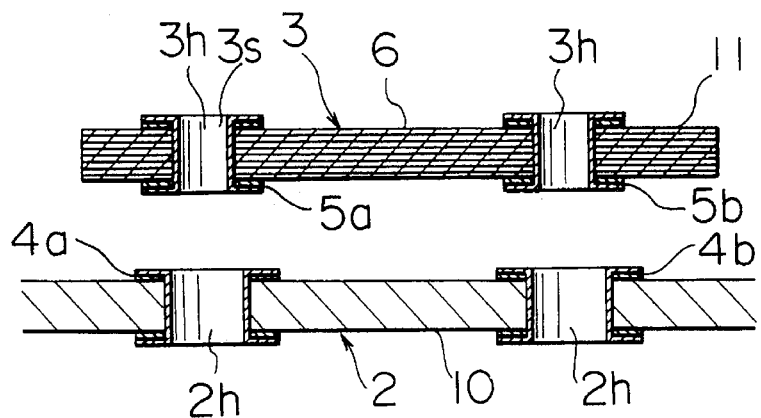
FIG. 4 is a vertical sectional view showing part of each printed substrate whose connection is performed by a connecting method according to another embodiment of the invention.
Figure 5:
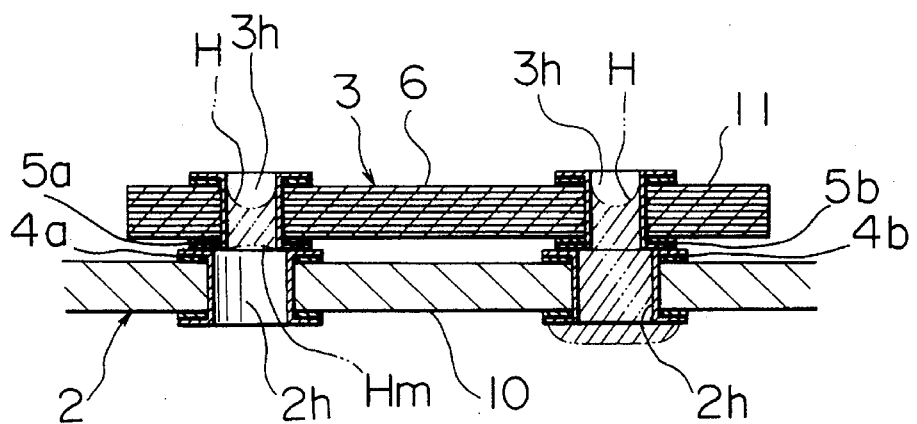
FIG. 5 is a vertical sectional view showing part of each printed substrate whose connection is performed by a connecting method of the same.

Another embodiment of the invention is described by referring to FIGS. 4 to 6.

In FIG. 4, 10 depicts a main printed substrate constituting a second printed substrate 2, 11 an auxiliary printed substrate constituting a second printed substrate 3, those of which are similar as in FIGS. 1 to 3.

On connecting the printed substrate 11 to the main printed substrate 10, in FIG. 1, a plurality of the first connection patterns 4a, 4b having through holes 2h are provided on the main printed substrate 10, and a plurality of the second connection patterns 5a, 5b having through holes 3h respectively opposing to the first connection patterns 4a, 4b are provided on the auxiliary printed substrate 11. The through holes 2h are allowed to have a diameter selected larger than that of the through holes 3h.

In FIG. 2, continuously in such state, the auxiliary printed substrate 11 is overlapped on the main printed substrate 10, a position of the through holes 2h of the first connection patterns 4a is made coincident to a position of the through holes 3 of the second connection patterns 5a, where the soldering by the reflow system is performed using the solder dipping vessel. The solder H thus enters into the through holes 2h and 3h, and the first connection patterns 4a and the second connection patterns 5a are connected each other.

The first connection patterns 4a and the second connection patterns 5a may be soldered by the reflow system. After the soldering has been performed by the reflow system, it is determined by the through hole 2h whether the result of soldering is right or wrong. In FIG. 5, solder Hm shows failure state due to lack of solder material, which is confirmed through the through hole 2h. Such soldering failure can easily be compensated by additionally soldering.

Figure 12:
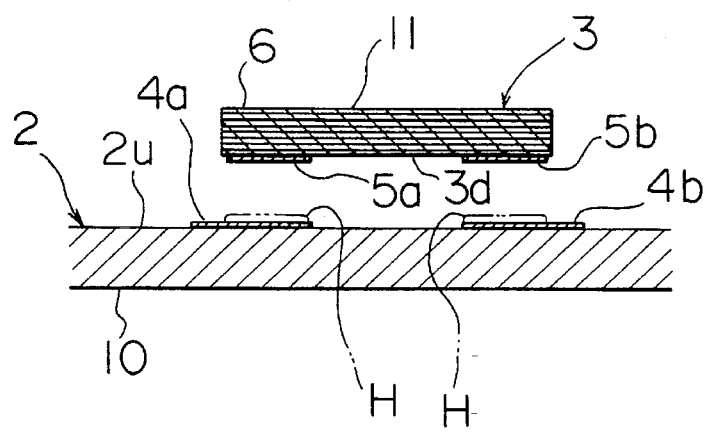
FIG. 12 is a vertical sectional view showing part of each printed substrate whose connection is performed by a connecting method according to a modified embodiment of the invention.
Figure 13:
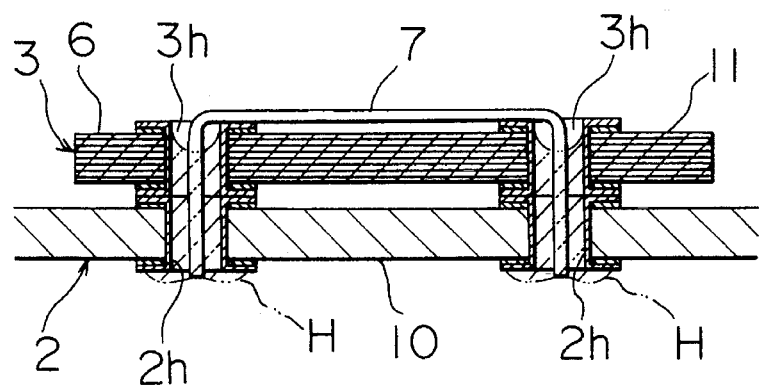
FIG. 13 is a vertical sectional view showing part of a printed substrate whose connection is performed by a connecting method according to another modified embodiment of the invention.

A modified embodiment of the invention is shown in FIGS. 12 and 13.

The modified embodiment in FIG. 12 is such that a plurality of first connection patterns 4a, 4b are provided on an upper surface 2u of the first printed substrate 2 (main printed substrate 10). This differs from the embodiment shown in FIGS. 1 to 3 in that no through hole is provided on the first connection patterns 4a, 4b. But, the second printed substrate 3 (auxiliary printed substrate 11) is the same as the embodiment in FIGS. 1 to 3. Therefore in this case, the first connection patterns 4a, 4b, which is coated with the cream solder, in the main printed substrate 10, is overlapped with the second connection patterns 5a, 5b in the second printed substrate 3, thus the soldering by the reflow system is achieved.

The modified embodiment shown in FIG. 13 is in that the through holes 2h in the first connection patterns 4a is allowed to have the same diameter as that of the through holes 3h in the second connection patterns 5a, simultaneously on soldering, the through holes 2h and 3h are soldered with, for example, C-character shaped bent wire material 7 in state that the material 7 are inserted between adjacent pairs of through holes 2h (3h) and through holes 3h (2h), those of which however differ from in FIGS. 4 to 6. The construction and method (of the invention) other than described above are the same as the embodiments shown in FIGS. 4 to 6. In this way, by inserting the wire material 7, the solder can easily enter into the through holes 2h and 3h, thereby a secure soldering (connection) can be performed.

As hereinbefore fully described, it is understood that the invention is not limited to the embodiments which have been described in this specification, the foregoing and the various modifications and changes can optionally be made therein without departing from the sprit of the present invention with respect to the detailed construction, shape, and quantity.

What is claimed is:

1. A connecting method for connecting a multi-layer printed substrate having a plurality of laminated unit substrates to a first printed substrate, comprising the steps of:
    providing a plurality of first connection patterns on an upper surface of the first printed substrate;
    providing a plurality of second connection patterns, facing the first connection patterns, on an under surface of the multi-layer printed substrate;
    providing the multi-layer printed substrate with coil patterns formed on at least two of the plurality of unit substrates;
    providing first through holes penetrating the first connection patterns and the first printed substrate;
    providing second through holes penetrating the second connection patterns and the multi-layer printed substrate for allowing the multi-layer printed substrate to be connected to the first printed substrate and penetrating the coil patterns to connect the coil patterns to each other;
    aligning the second through holes and the first through holes; and
    soldering the first connection patterns and the second connection patterns to connect the multi-layer printed substrate to the first printed substrate.

2. The connecting method of claim 1, wherein the first through holes have a diameter which is greater than a diameter of the second through holes.

3. A connecting method for connecting a multi-layer printed substrate having a plurality of laminated unit substrates to a first printed substrate comprising the steps of:
    forming a plurality of first connection patterns on the first printed substrate, said first connection patterns having first through holes penetrating the first connection patterns and the first printed substrate;
    forming a plurality of second connection patterns, facing the first connection patterns and, on the multi-layer printed substrate;
    providing the multi-layer printed substrate with coil patterns on at least two of the plurality of unit substrates;
    forming second through holes penetrating the multi-layer printed substrate for allowing the multi-layer printed substrate to be connected to the first printed substrate and penetrating the coil patterns to connect the coil patterns to each other; and
    soldering the first connection patterns to the second connection patterns to connect the multi-layer printed substrate to the first printed substrate.

4. The connecting method of claim 3, wherein the first connection patterns and the second connection patterns are soldered by a reflow system using cream solder material.

5. The connecting method of claim 3, wherein the first connection patterns and the second connection patterns are soldered by a reflow system using a solder dipping vessel.

6. The connecting method of claim 3, wherein the vent holes are through holes.

7. The connecting method of claim 6, wherein a through hole diameter in the first printed substrate is greater than a through hole diameter in the multi-layer printed substrate.

8. The connecting method of claim 6, wherein the soldering step is performed after inserting a wire member between the through hole in the first printed substrate and the through hole in the multi-layer printed substrate.

9. An apparatus comprising:
    a multi-layer printed substrate having a plurality of laminated unit substrates and coil patterns formed on at least two of the unit substrates;

a first printed substrate;

first connection patterns provided on an upper surface of said first printed substrate;

first through holes penetrating the first connection patterns and the first printed substrate;

second connection patterns, facing the first connection patterns, provided on an under surface of the multi-layer printed substrate; and second through holes penetrating the second connection patterns and the multi-layer printed substrate for allowing the multi-layer printed substrate to be connected to the first printed substrate and penetrating the coil patterns to connect the coil patterns to each other, wherein the second through holes are axially aligned with the first through holes, wherein the multi-layer printed substrate is connected to the printed substrate by soldering the first and second connection patterns.

10. The apparatus of claim 9 wherein the second through holes are vent holes.

11. The apparatus of claim 9, wherein a diameter of the first through holes is greater than a diameter of the second through holes.

12. The apparatus of claim 9, wherein the connection between the multi-layer printed substrate and the first printed substrate is an electrical, mechanical or electro-mechanical connection.

13. The apparatus of claim 9, further comprising a wire member inserted between one of the first through holes and one of the second through holes.

* * * * *